(12) United States Patent  
Iseki

(10) Patent No.: US 7,115,194 B2
(45) Date of Patent: Oct. 3, 2006

(54) MAGNETRON SPUTTERING APPARATUS

(75) Inventor: Takayuki Iseki, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 157 days.

(21) Appl. No.: 10/786,547

(22) Filed: Feb. 26, 2004

(65) Prior Publication Data

US 2004/0163951 A1 Aug. 26, 2004

(30) Foreign Application Priority Data

Sep. 30, 2002 (JP) ............... 2002-286238
Sep. 30, 2003 (JP) ............... 2003-341258

(51) Int. Cl.
*C23C 14/35* (2006.01)

(52) U.S. Cl. ............... 204/298.2; 204/298.19

(58) Field of Classification Search ........... 204/298.16, 204/298.17, 298.19, 298.2, 192.12
See application file for complete search history.

(56) References Cited

U.S. PATENT DOCUMENTS

| | | | |
|---|---|---|---|
| 4,964,968 A | 10/1990 | Arita | |
| 5,399,253 A * | 3/1995 | Grunenfelder | 204/298.2 |
| 5,439,574 A * | 8/1995 | Kobayashi et al. | 204/192.12 |
| 5,470,452 A | 11/1995 | Dickey et al. | |
| 6,224,725 B1 | 5/2001 | Glocker | |
| 6,344,114 B1 | 2/2002 | Sichmann et al. | |

FOREIGN PATENT DOCUMENTS

| | | | |
|---|---|---|---|
| GB | 2241710 | * | 9/1991 |
| JP | 02-277771 | * | 11/1990 |
| JP | 04-371575 | * | 12/1992 |
| JP | 07-166346 | * | 6/1995 |
| JP | 2002-069637 | | 3/2002 |

* cited by examiner

*Primary Examiner*—Rodney G. McDonald
(74) *Attorney, Agent, or Firm*—Connolly Bove Lodge & Hutz LLP

(57) ABSTRACT

A magnetron sputtering apparatus 1 is composed of a vacuum chamber 2, a target 3, a cathode 4 that holds the target 3 in the vacuum chamber 2, a substrate 5, an anode 6 that holds the substrate 5 and is allocated above the cathode 4 so as to face the substrate 5 toward the target 3 on the cathode 4, a permanent magnet 71 that generates magnetic field 141 and is allocated under the cathode 4, and a rotation controller 12 for rotating the permanent magnet 71 so as to pivot on a center axis of the target 3. The permanent magnet 71 is further composed of a base 8, a first permanent magnet 91 that is fixed on the base 8 in the middle and a second permanent magnet 101 in a ring shape that is fixed in an external circumferential area of the base 8 so as to surround the first permanent magnet 91, wherein a magnetic polarity of the second permanent magnet 101 is inverse with respect to that of the first permanent magnet 91 and magnetic field strength of the second permanent magnet 101 is weaker than that of the first permanent magnet 91, and further an upper portion of the permanent magnet 71 is in a cylindrical shape of which top portion is cut diagonally.

4 Claims, 9 Drawing Sheets

MAGNETRON SPUTTERING APPARATUS

BACKGROUND OF THE INVENTION

1. Field of the Invention

The present invention relates to a magnetron sputtering apparatus, particularly, relates to a magnetron sputtering apparatus having a yoke-type permanent magnet, which enables higher target usable efficiency.

2. Description of the Related Arts

A magnetron sputtering apparatus has been commonly used as a sputtering apparatus until now.

FIG. 5(d) is a conceptional cross sectional view of a target formed with an erosion portion according to the conventional magnetron sputtering apparatus of the prior art.

FIG. 6(d) shows a measured cross sectional view of an erosion portion formed on the target exhibiting an actual erosion portion measured in the radial direction from the center of the target according to the conventional magnetron sputtering apparatus of the prior art.

FIG. 13 is a cross sectional view of a conventional magnetron sputtering apparatus according to the prior art. In FIG. 13, a conventional magnetron sputtering apparatus 19 is composed of a vacuum chamber 2, a target 3, a cathode 4, a substrate 5, an anode 6 and a yoke-type permanent magnet 79. The target 3 is placed on the cathode 4 and allocated inside the vacuum chamber 2. The substrate 5 is loaded on the anode 6 so as to face toward the target 3 on the cathode 4. The yoke-type permanent magnet 79 is provided under the cathode 4 for generating a magnetic field 149.

The yoke-type permanent magnet 79 is further composed of a base 8, a first yoke-type permanent magnet 99, which is fixed at the center portion of the base 8, and a second yoke-type permanent magnet 109 in a ring shape, which is fixed at the outer circumference area of the base 8 so as to surround the first yoke-type permanent magnet 99. In the first yoke-type permanent magnet 99, the top surface is the N-pole and the bottom surface is the S-pole. On the contrary, in the case of the second yoke-type permanent magnet 109, the top surface is the S-pole and the bottom surface is the N-pole. These top surfaces of the first and second yoke-type permanent magnets 99 and 109, that is, the top surfaces of the yoke type permanent magnet 79 are on the same plane. The magnetic field 149 generates from the N-pole side of the first yoke-type permanent magnet 99 and goes toward the S-pole side of the second yoke-type permanent magnet 109.

Operations of the magnetron sputtering apparatus 19 are explained next.

After gas such as Ar has been introduced into the vacuum chamber 2, high frequency electric power or large DC (direct current) power supplied from a not shown power source is applied to the cathode 4, and then plasma is generated. The generated plasma is trapped by the magnetic field 149. Since majority of the plasma is trapped at a portion where the magnetic field 149 is perpendicular to the surface of the target 3 particularly, plasma density becomes higher in the surface of the target 3 where the magnetic field 149 intersects vertically. Consequently, sputtering can be conducted efficiently.

However, as shown in FIG. 13, the portion of the target 3 where the plasma converged on is sputtered intensively, so that erosion portions 139a and 139b, which are scraped out deeply, are formed on the surface of the target 3 if the target 3 is used continuously. The conceptional cross section of the erosion portions 139a and 139b and their measured cross section are shown in FIG. 5(d) and FIG. 6(d) respectively.

Consequently, the target 3 can not be used anymore although flat surfaces other than the erosion portions 139a and 139b are left in large areas.

In order to solve the above-mentioned problem, there exists the magnetron sputtering apparatus that is disclosed in the Japanese Patent Application Laid-open Publication No. 2002-069637.

The Japanese Patent Application Laid-open Publication No. 2002-069637 discloses the magnetron sputtering apparatus, wherein magnetic field generated by the first yoke-type permanent magnet 99 and the second yoke-type permanent magnet 109 are conducted to be different strength respectively and the apparatus is provided with a transfer device for moving the yoke-type permanent magnet 79 vertically in comparison with the magnetron sputtering apparatus 19 shown in FIG. 13.

However, cooling water is essential to be circulated in the cathode 4. Consequently, further problem occurs such that mechanism is very complicated in order to provide the transfer device, which moves vertically without leaking water.

Further, there exists a limit for improving target usable efficiency because a portion of the target 3 where the center magnetic pole of a permanent magnet is positioned is apt to become a non-erosion portion.

SUMMARY OF THE INVENTION

Accordingly, in consideration of the above-mentioned problems of the prior art, an object of the present invention is to provide a magnetron sputtering apparatus, which is composed of a target that is simple in constitution and high in usable efficiency.

In order to achieve the above object, the present invention provides, according to an aspect thereof, a magnetron sputtering apparatus comprising: a vacuum chamber; a target; a cathode holding the target in the vacuum chamber; a substrate; an anode holding the substrate and being allocated above the cathode so as to face the substrate toward the target on the cathode; a permanent magnet generating magnetic field and being allocated under the cathode; and a rotation controller rotating the permanent magnet so as to pivot on almost a center of the target, the permanent magnet further comprising: a base; a first permanent magnet being fixed on the base in the middle; and a second permanent magnet in a ring shape being fixed in a peripheral area of the base so as to surround the first permanent magnet, wherein a magnetic polarity of the second permanent magnet is inverse with respect to a magnetic polarity of the first permanent magnet, and wherein magnetic field strength of the second permanent magnet is weaker than magnetic field strength of the first permanent magnet, and wherein the permanent magnet is in a cylindrical shape of which top portion is cut diagonally, the magnetron sputtering apparatus is characterized in that the permanent magnet is perpendicularly allocated on a top of the axis of rotation of the rotation controller.

According to another aspect of the present invention, there provided a magnetron sputtering apparatus comprising: a vacuum chamber; a target; a cathode holding the target in the vacuum chamber; a substrate; an anode holding the substrate and being allocated above the cathode so as to face the substrate toward the target on the cathode; and a permanent magnet generating magnetic field and being allocated under the cathode, the permanent magnet further comprising: a first permanent magnet provided with a sliding mechanism for sliding the first permanent magnet horizontally with respect to the target, being allocated in the middle of the target; and a second permanent magnet being fixed in a peripheral area of the target, wherein a magnetic polarity of the second permanent magnet is inverse with respect to a magnetic polarity of the first permanent magnet, and wherein magnetic field strength of the second permanent magnet is weaker than magnetic field strength of the first permanent magnet, and wherein a top surface of the second permanent magnet is in parallel with a top surface of the first permanent magnet.

Other object and further features of the present invention will be apparent from the following detailed description when read in conjunction with the accompanying drawings.

DETAILED DESCRIPTION OF THE PREFERRED EMBODIMENTS

[First Embodiment]

Figure 1:
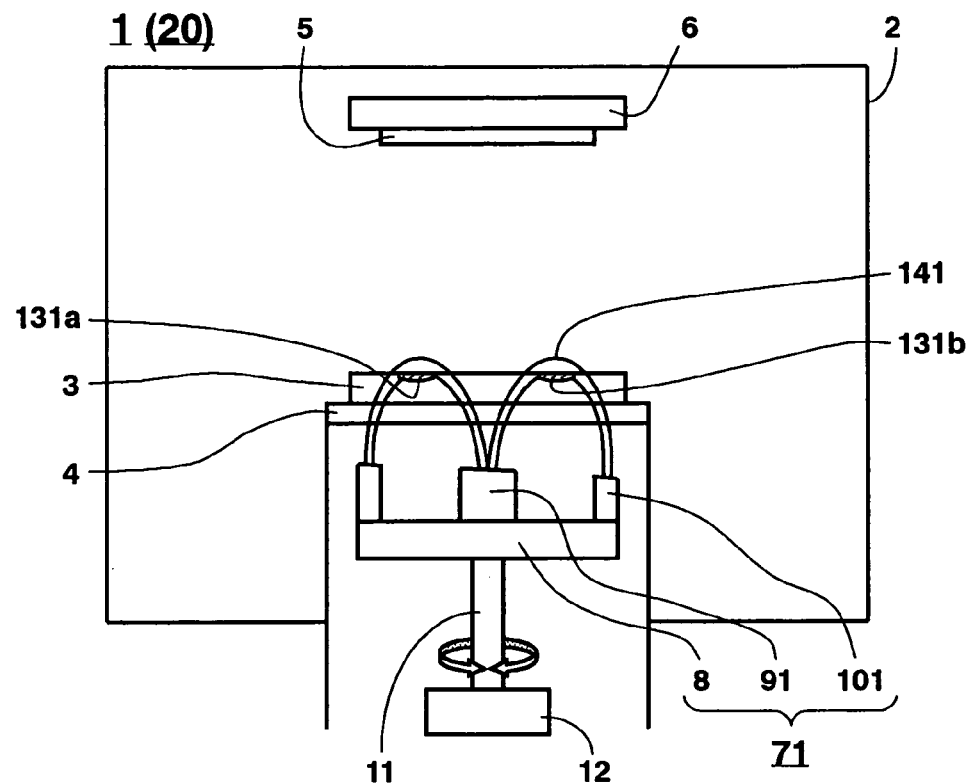
FIG. 1 is a cross sectional view of a magnetron sputtering apparatus according to a first embodiment of the present invention.

FIG. 1 is a cross sectional view of a magnetron sputtering apparatus according to a first embodiment of the present invention.

Figure 2:
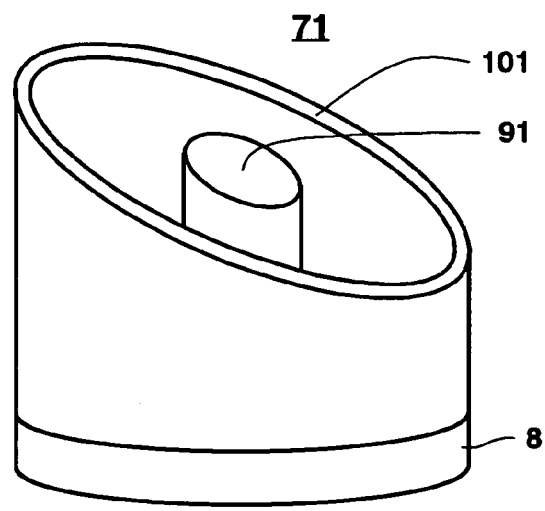
FIG. 2 is a perspective view of a yoke-type permanent magnet provided in the magnetron sputtering apparatus shown in FIG. 1 exhibiting its configuration.

FIG. 2 is a perspective view of a yoke-type permanent magnet provided in the magnetron sputtering apparatus shown in FIG. 1 exhibiting its configuration.

Figure 3:
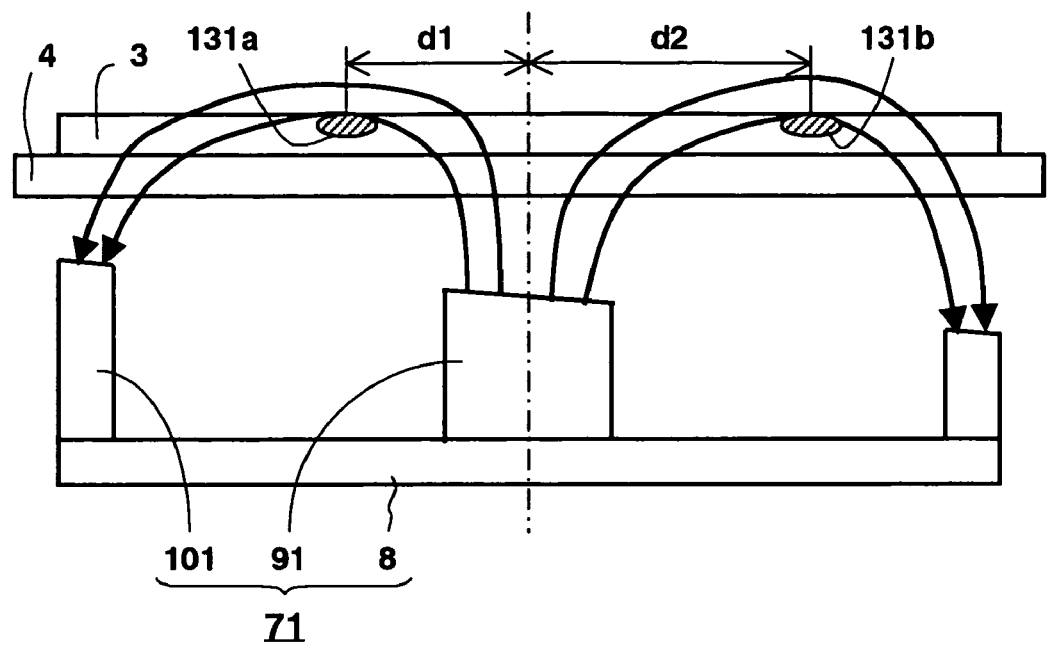
FIG. 3 is an enlarged cross sectional view of a neighborhood area of a yoke-type permanent magnet in order to explain an erosion portion to be formed on a target, wherein the top surface of the yoke-type permanent magnet is slanted from the upper left to the lower right.

FIG. 3 is an enlarged cross sectional view of a neighborhood area of a yoke-type permanent magnet in order to explain an erosion portion to be formed on a target, wherein the top surface of the yoke-type permanent magnet is slanted from the upper left to the lower right.

Figure 4:
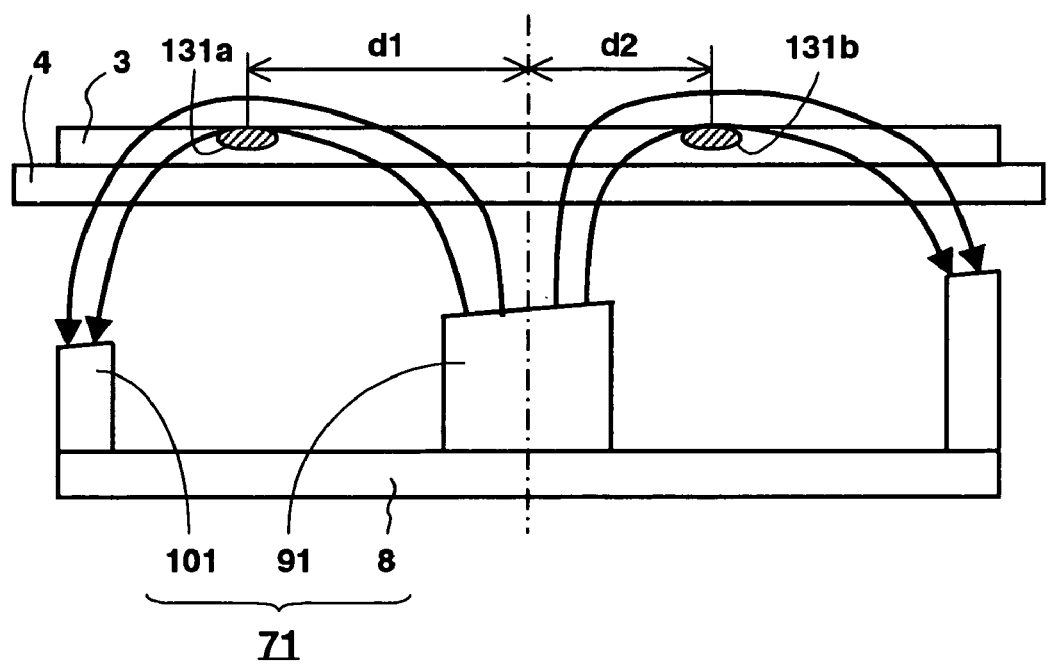
FIG. 4 is an enlarged cross sectional view of a neighborhood area of a yoke-type permanent magnet in order to explain an erosion portion to be formed on a target, wherein the top surface of the yoke-type permanent magnet is slanted from the upper right to the lower left.

FIG. 4 is an enlarged cross sectional view of a neighborhood area of a yoke-type permanent magnet in order to explain an erosion portion to be formed on a target, wherein the top surface of the yoke-type permanent magnet is slanted from the upper right to the lower left.

Figure 5A:
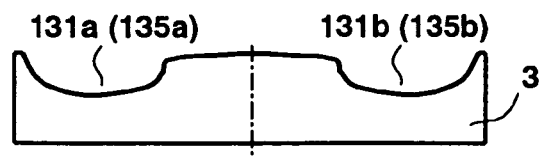
FIG. 5(a) is a conceptional cross sectional view of a target formed with an erosion portion according to a first and fourth embodiment of the present invention.

FIG. 5(a) is a conceptional cross sectional view of a target formed with an erosion portion according to a first and fourth embodiment of the present invention.

Figure 6A:
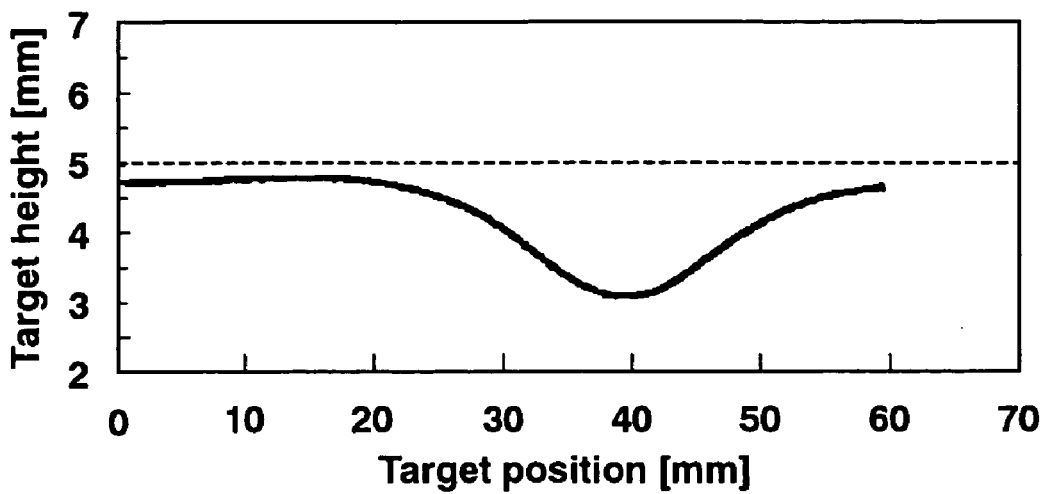
FIG. 6(a) shows a measured cross sectional view of an erosion portion formed on the target exhibiting an actual erosion portion measured in the radial direction from the center of the target according to the first and fourth embodiment of the present invention.

FIG. 6(a) shows a measured cross sectional view of an erosion portion formed on the target exhibiting an actual erosion portion measured in the radial direction from the center of the target according to the first and fourth embodiment of the present invention.

In FIG. 1, a magnetron sputtering apparatus 1 is composed of a vacuum chamber 2, a target 3, a cathode 4, a substrate 5, an anode 6, a yoke-type permanent magnet 71, a driving shaft 11 and a rotation controller 12. The target 3 is held by the cathode 4 and allocated inside the vacuum chamber 2. The substrate 5 is held by the anode 6 so as to face toward the target 3 on the cathode 4. The yoke-type permanent magnet 71 is provided under the cathode 4 for generating a magnetic field 141. The rotation controller 12 rotates the yoke-type permanent magnet 71 through the driving shaft 11 so as to pivot on the center of the target 3.

As shown in FIGS. 1 and 2, the yoke-type permanent magnet 71 is composed of a base 8, a first yoke-type permanent magnet 91 having a slanted top surface fixed on the base 8 in the middle and a second yoke-type permanent magnet 101 in a ring shape. The second yoke-type permanent magnet 101 is fixed in the outer circumference area of the base 8 so as to surround the first yoke-type permanent magnet 91, and the top surface of the yoke-type permanent magnet 101 is also slanted in the same slant angle as that of the first yoke-type permanent magnet 91. The first yoke-type permanent magnet 91 is formed by NdFeB magnet, for example. The top surface of the first yoke-type permanent magnet 91 is the N-pole and the bottom surface is the S-pole. On the other hand, in the case of the second yoke-type permanent magnet 101, the top and the bottom surfaces are the S-pole and the N-pole respectively. The top surface of the second yoke-type permanent magnet 101 is magnetized by the first yoke-type permanent magnet 91 and resulted in having weaker magnetic field than that generated by magnetization of the top surface of the first yoke-type permanent magnet 91.

Since magnetic field strength on the top surface of the first yoke-type permanent magnet 91 is stronger than that on the top surface of the second yoke-type permanent magnet 101, the magnetic field 141 generated by the yoke-type permanent magnet 71 is distributed so as to expand from the top surface of the first yoke-type permanent magnet 91 to the top surface of the second yoke-type permanent magnet 101.

Materials constituting the yoke-type permanent magnet 71 are the same as those of the magnetron sputtering apparatus disclosed in the Japanese Patent Application Laid-open Publication. No. 2002-069637.

In the yoke-type permanent magnet 71, the second yoke-type permanent magnet 101 is made to be slanted as shown in FIG. 2, so that height of the magnetic pole of the second yoke-type permanent magnet 101 is different in either left side or right side. Consequently, as shown in FIGS. 3 and 4, erosion portions 131a and 131b appearing on the surface of the target 3 are formed in asymmetrical positions with respect to the center of the target 3 respectively.

In a case that the yoke-type permanent magnet 71 is slanted from the upper left to the lower right as shown in FIG. 3, the erosion portion 131a in the left side is formed in a position being closer to the center of the target 3 than the erosion portion 131b in the right side.

In other words, when positions of the erosion portions 131a and 131b from the center of the target 3 are defined as d1 and d2 respectively, a positional relationship between the erosion portions 131a and 131b becomes "d1<d2".

On the contrary, in a case that the yoke-type permanent magnet 71 is slanted from the upper right to the lower left as shown in FIG. 4, the erosion portion 131b in the right side is formed in a position being closer to the center of the target 3 than the erosion portion 131a in the left side.

In other words, a positional relationship between the erosion portions 131a and 131b becomes "d1>d2".

When sputtering the target 3 is conducted by generating plasma after introducing gas such as Ar into the vacuum chamber 2 while rotating the yoke-type permanent magnet 71 by driving the rotation controller 12, as mentioned above, positions of the erosion portions 131a and 131b can be changed continuously.

Accordingly, an effect of expanding erosion, which is similar to that caused by the magnetron sputtering apparatus according to the Japanese Patent Application Laid-open Publication No. 2002-069637, can be realized, and resulting in expanding the erosion portions 131a and 131b over the target 3 in comparison with the conventional magnetron sputtering apparatuses.

Further, a configuration of the yoke-type permanent magnet 71 necessary for obtaining the above-mentioned effect is not limited to the cylindrical shape of which top portion is cut diagonally as shown in FIG. 2. It should be understood that the yoke-type permanent magnet 71 enables to be in any configuration, for example, a configuration having steps in which each height of surfaces of magnetic poles is different in either the left side or the right side when viewing from a cross section.

According to an examination about a shape of the erosion portions 131a and 131b formed on the target 3 when the target 3 is sputtered by using the magnetron sputtering apparatus 1 of the first embodiment of the present invention, the shape results in a cross section shown in FIG. 5(a). Its measured cross section is shown in FIG. 6(a).

In addition thereto, sputtering conditions for forming the erosion portions 131a–139a and 131b–139b shown in FIGS. 5(a) to 5(d) and 6(a) to 6(d) are as follows: the target 3 is an aluminum (Al) disc having a diameter of 5 inches, sputtering pressure is 3 mTorr and sputtering time is 113 hours under a condition of supplying 300 W of electric power.

Figure 5B:
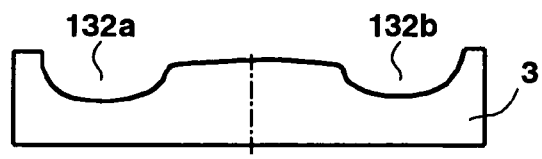
FIG. 5(b) is a conceptional cross sectional view of a target formed with an erosion portion according to a second and third embodiment of the present invention.
Figure 5C:
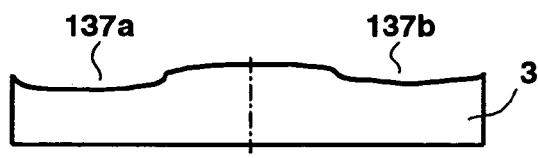
FIG. 5(c) is a conceptional cross sectional view of a target formed with an erosion portion according to a fifth embodiment of the present invention.
Figure 5D:
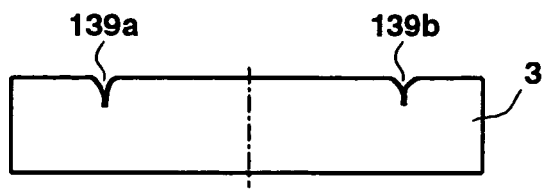
FIG. 5(d) is a conceptional cross sectional view of a target formed with an erosion portion according to the conventional magnetron sputtering apparatus of the prior art.

As shown in FIG. 5(a), the erosion portions 131a and 131b are symmetrical with respect to the center axis of the target 3 and expanded more in comparison with the erosion portions 139a and 139b shown in FIG. 5(d) formed by the conventional magnetron-sputtering apparatus 19 of the prior art. Usable efficiency of the target 3 according to the first embodiment of the present invention is 30 to 50%, which is almost the same as that of the magnetron sputtering apparatus according to the Japanese Patent Application Laid-open Publication No. 2002-069637.

As mentioned above, according to the first embodiment of the present invention, the yoke-type permanent magnet 71 is composed of the base 8, the first yoke-type permanent magnet 91 being fixed on the base 8 in the middle and the second yoke-type permanent magnet 101, which is fixed in the outer circumference area of the base 8 so as to surround the first yoke-type permanent magnet 91, wherein polarity of the magnetic pole of the second yoke-type permanent magnet 101 is inversely arranged with respect to that of the first yoke-type permanent magnet 91 and magnetic field strength of the second yoke-type permanent magnet 101 is weaker than that of the first yoke-type permanent magnet 91.

Further, the upper portion of the yoke-type permanent magnet 71 is formed in a cylindrical shape of which top portion is cut diagonally as shown in FIG. 2 or a shape having different heights in the left and right sides with respect to the axis of rotation, so that the erosion portions 131a and 131b are possible to be expanded only by rotating the yoke-type permanent magnet 71.

Accordingly, the magnetron sputtering apparatus 1 having a target high in usable efficiency can be realized even in a simple configuration.

It should be understood that the shape of the yoke-type permanent magnet 71 is not limited to the cylindrical shape of which top portion is cut diagonally as shown in FIG. 2, but a shape having different heights of which height steps down gradually from one end to the other like a stair is also applicable.

[Second Embodiment]

In this second embodiment, the same constitution as the first embodiment is denoted by the same reference sign and its explanations will be omitted.

FIG. 5(b) is a conceptional cross sectional view of a target formed with an erosion portion according to a second and third embodiment of the present invention.

Figure 6B:
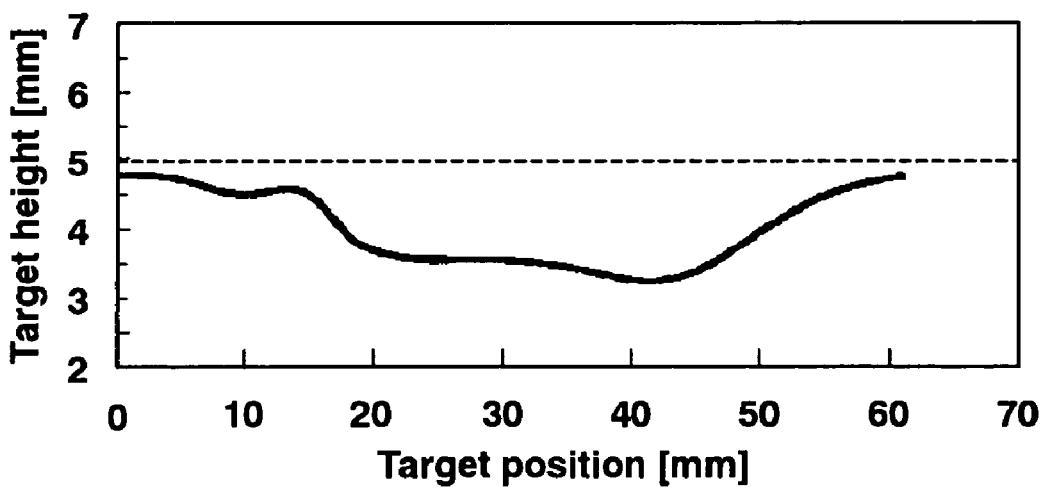
FIG. 6(b) shows a measured cross sectional view of an erosion portion formed on the target exhibiting an actual erosion portion measured in the radial direction from the center of the target according to the second and third embodiment of the present invention.

FIG. 6(b) shows a measured cross sectional view of an erosion portion formed on the target exhibiting an actual erosion portion measured in the radial direction from the center of the target according to the second and third embodiment of the present invention.

Figure 7:
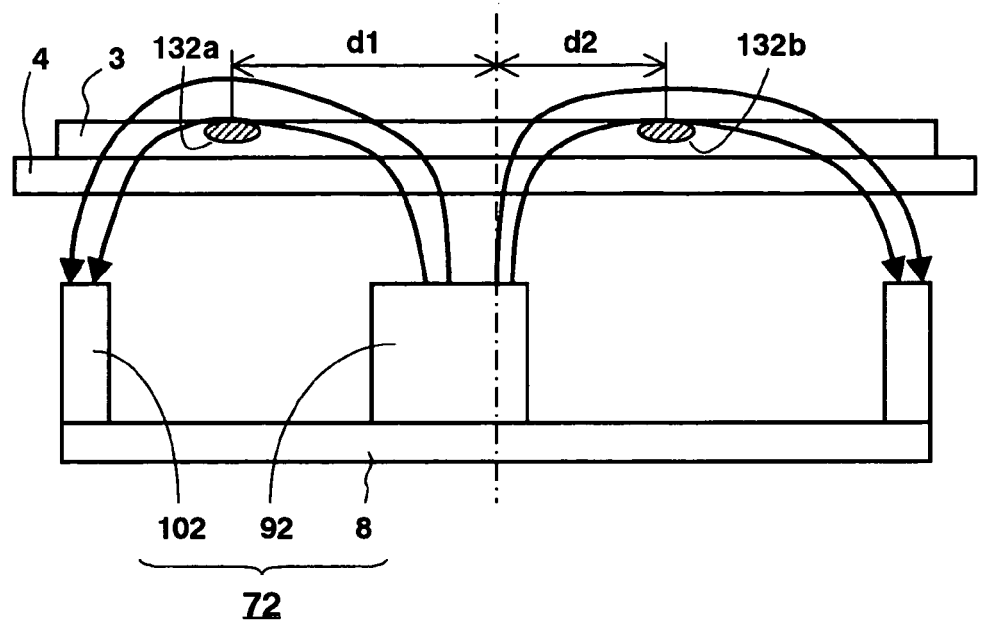
FIG. 7 is an enlarged cross sectional view of a neighborhood area of a yoke-type permanent magnet according to the second embodiment of the present invention in order to explain a erosion portion to be formed on a target, wherein the center of a first yoke-type permanent magnet is shifted to the left with respect to the center of the target.

FIG. 7 is an enlarged cross sectional view of a neighborhood area of a yoke-type permanent magnet according to the second embodiment of the present invention in order to explain a erosion portion to be formed on a target, wherein the center of a first yoke-type permanent magnet is shifted to the left with respect to the center of the target.

Figure 8:
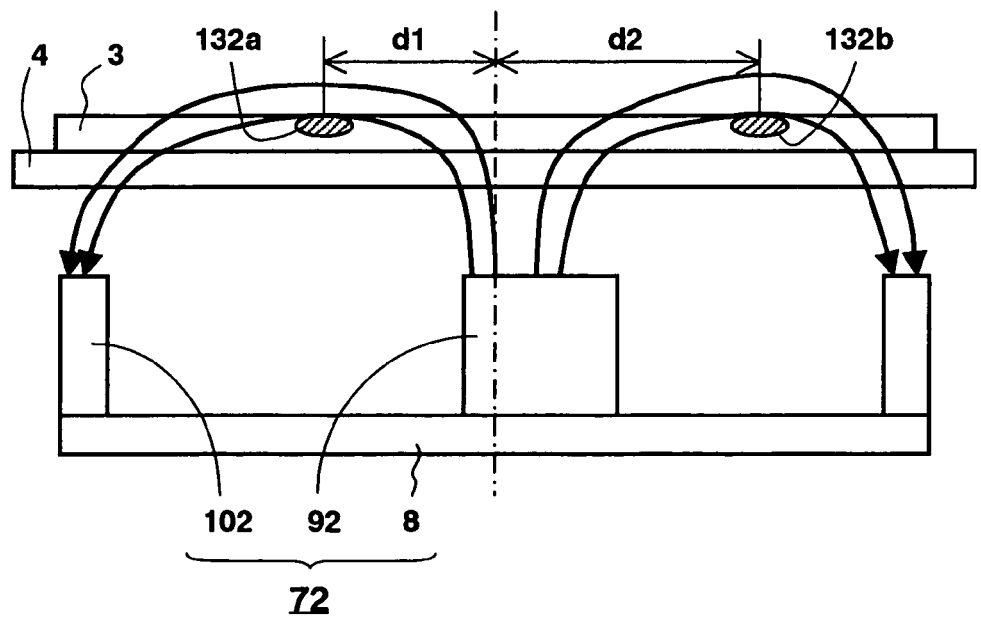
FIG. 8 is an enlarged cross sectional view of a neighborhood area of a yoke-type permanent magnet in order to explain a erosion portion to be formed on a target, wherein the center of a first yoke-type permanent magnet is shifted to the right with respect to the center of the target.

FIG. 8 is an enlarged cross sectional view of a neighborhood area of a yoke-type permanent magnet in order to explain a erosion portion to be formed on a target, wherein the center of a first yoke-type permanent magnet is shifted to the right with respect to the center of the target.

In FIGS. 7 and 8, a yoke-type permanent magnet 72 is similar to the yoke-type permanent magnet 71 of the first embodiment except for the top surfaces of first and second yoke-type permanent magnets 92 and 102 and a location of the first yoke-type permanent magnet 92. In the yoke-type permanent magnet 72, a center axis of the first yoke-type permanent magnet 92 is shifted from the center axis of the target 3. The top surface of the second yoke-type permanent magnet 102 is made to be in parallel with the top surface of the first yoke-type permanent magnet 92. In other words, the top surfaces of the first and second yoke-type permanent magnets 92 and 102 are made to be flat horizontally and in parallel with the base 8 respectively.

In a case of the second embodiment, the yoke-type permanent magnet 72 is constituted such that the center axis of the first yoke-type permanent magnet 92 is shifted eccentrically from the center axis of the target 3 or the center of rotation of the yoke-type permanent magnet 72, so that erosion portions 132a and 132b are formed in different positions that are asymmetrical with respect to the center axis of the target 3.

In a case that the center axis of the first yoke-type permanent magnet 92 is shifted eccentrically to the left with respect to the center axis of the target 3 as shown in FIG. 7, a positional relationship between the erosion portions 132a and 132b on the target 3 becomes "d1>d2".

On the contrary, in a case that the center axis of the first yoke-type permanent magnet 92 is shifted eccentrically to the right with respect to the center axis of the target 3 as shown in FIG. 8, a positional relationship between the erosion portions 132a and 132b on the target 3 becomes "d1<d2".

When sputtering the target 3 is conducted by generating plasma after introducing gas such as Ar into the vacuum chamber 2 while rotating the yoke-type permanent magnet 72 by driving the rotation controller 12, as the same manner as the first embodiment, positions of the erosion portions 132a and 132b can be changed continuously. As a position of center magnetic pole of the first yoke-type permanent magnet 92 changes, particularly, a non-erosion area decreases and resulting in expanding the erosion portions 132a and 132b on the target 3 furthermore in comparison with the prior art.

Further, in the case of the second embodiment, it is not necessary to the yoke-type permanent magnet 72 that magnetic field of the first yoke-type permanent magnet 92 is stronger than that of the second yoke-type permanent magnet 102 as the yoke-type permanent magnet 71 of the first embodiment is. However, an erosion portion can be effectively expanded furthermore by applying the same configuration as the first embodiment to the yoke-type permanent magnet 72.

According to an examination about a shape of the erosion portions 132a and 132b formed on the target 3 when the target 3 is sputtered by using a magnetron sputtering apparatus 20 of the second embodiment of the present invention, the shape results in a cross section shown in FIG. 5(b). Its measured cross section is shown in FIG. 6(b).

As shown in FIG. 5(b), the erosion portions 132a and 132b are symmetrical with respect to the center axis of the target 3 and their shapes are almost the same as those of the first embodiment shown in FIG. 5(a). In other words, usable efficiency of the target 3 according to the second embodiment of the present invention is 30 to 50%.

As mentioned above, according to the second embodiment, a center portion of the target 3 is also sputtered, so that the magnetron sputtering apparatus 20 having the target 3 that is high in usable efficiency can be realized as the same manner as the first embodiment.

[Third Embodiment]

In this third embodiment, the same constitution as the first and second embodiment is denoted by the same reference sign and its explanation will be omitted.

In a case of the third embodiment, it is different from the second embodiment that only a first yoke-type permanent magnet 92 swings in the horizontal direction and a relative distance from the second yoke-type permanent magnet 102 changes instead of rotating the yoke-type permanent magnet 72 totally. An operational principle of the third embodiment is supposed to be identical to that of the second embodiment, so that an effect of the third embodiment is almost the same as that of the second embodiment. Consequently, detailed explanation is omitted because operations are similar to those shown in FIGS. 7 and 8.

In the case of the second embodiment, since a permanent magnet is rotated, the target 3 and the first and second yoke-type permanent magnets 92 and 102 are basically in a circular shape. On the contrary, in the case of the third embodiment, since a total permanent magnet including first and second yoke-type permanent magnets does not rotate, a magnetron sputtering apparatus of the third embodiment is capable of a rectangular target for filming on a larger substrate.

As mentioned above, according to the third embodiment of the present invention, sputtering is conducted by sliding horizontally the first yoke-type permanent magnet 92 alone, so that the same effect as the second embodiment can be obtained, and also the magnetron sputtering apparatus of the third embodiment is capable of a rectangular target.

[Fourth Embodiment]

In this fourth embodiment, the same constitution as the first embodiment is denoted by the same reference sign and its explanation will be omitted.

FIG. 5(a) is a conceptional cross sectional view of a target formed with an erosion portion according to a first and fourth embodiment of the present invention.

FIG. 6(a) shows a measured cross sectional view of an erosion portion formed on the target exhibiting an actual erosion portion measured in the radial direction from the center of the target according to the first and fourth embodiment of the present invention.

Figure 9:
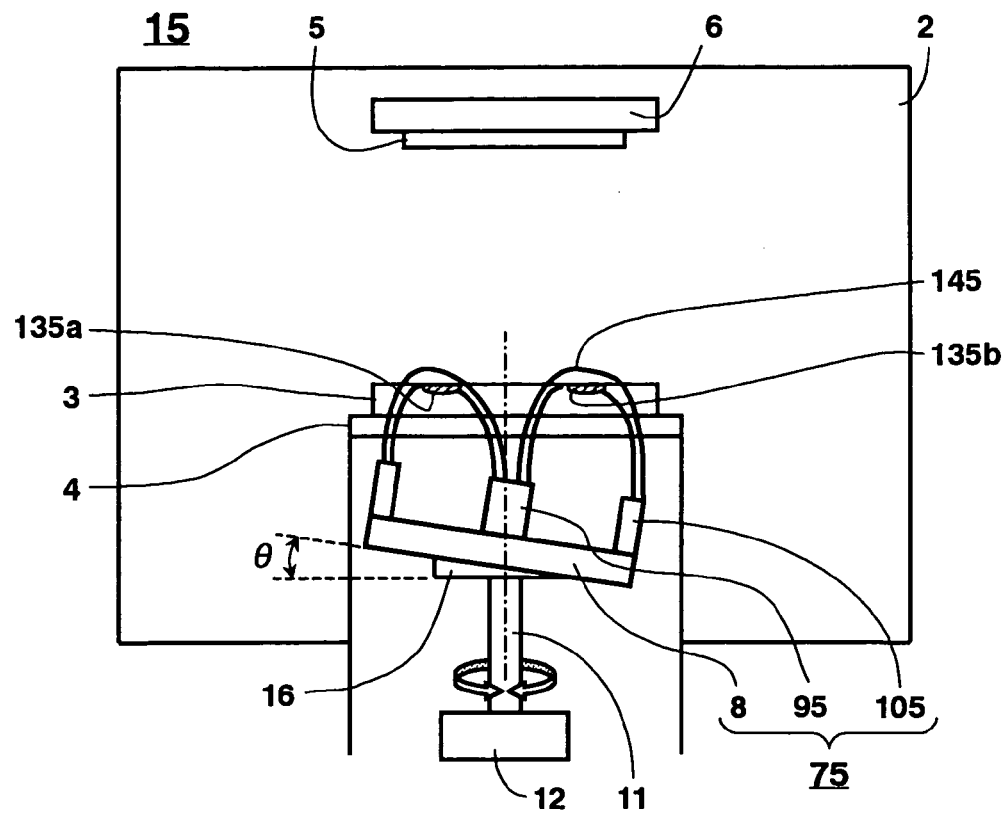
FIG. 9 is a cross sectional view of a magnetron sputtering apparatus according to the fourth embodiment of the present invention.

FIG. 9 is a cross sectional view of a magnetron sputtering apparatus according to the fourth embodiment of the present invention.

Figure 10:
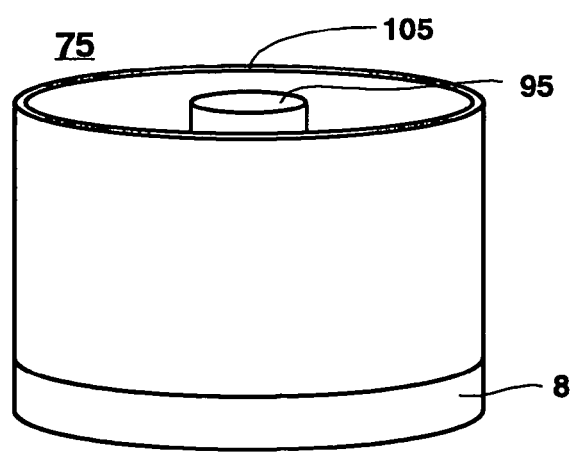
FIG. 10 is a perspective view of a yoke-type permanent magnet provided in the magnetron sputtering apparatus shown in FIG. 9 exhibiting its configuration.

FIG. 10 is a perspective view of a yoke-type permanent magnet provided in the magnetron sputtering apparatus shown in FIG. 9 exhibiting its configuration.

In FIG. 9, a magnetron sputtering apparatus 15 is identical to the magnetron sputtering apparatus 1 of the first embodiment except for a yoke-type permanent magnet 75 and a member 16 shaped in wedge, wherein a reference sign 145 denotes magnetic field generated by the yoke-type permanent magnet 75. The yoke-type permanent magnet 75 is composed of a first yoke-type permanent magnet 95 and a second yoke-type permanent magnet 105, wherein a center axis of the first yoke-type permanent magnet 95 is positioned on the center axis of the base 8. As shown in FIG. 10, top surfaces of the first and second yoke-type permanent magnets 95 and 105 are made to be flat horizontally and in parallel with the base 8 respectively. The yoke-type permanent magnet 75 is mounted on the top of the driving shaft 11 of the rotation controller 12 by means of the member 16 having a slant angle e. In this fourth embodiment, the slant angle θ of the member 16 is 8 degrees.

The same effect as the first embodiment can be obtained by using the member 16 having a predetermined slant angle θ, as mentioned above, instead of slanting the top surface of the yoke-type permanent magnet 75.

Further, making a top surface of a yoke-type permanent magnet to have a predetermined slant angle is complicated. On the contrary, in the case of the member 16, forming a wedge shape having a predetermined slant angle θ is relatively easier because any material can be used for the member 16. Consequently, the magnetron sputtering apparatus 15 can be manufactured in less expense cost.

In addition thereto, a shape of erosion portions 135a and 135b formed on the target 3 by using the magnetron sputtering apparatus 15 of the fourth embodiment of the present invention is the same as that of the first embodiment shown in FIG. 5(a). Its measured cross section is shown in FIG. 6(a).

[Fifth Embodiment]

In this fifth embodiment, the same constitution as the first, second and fourth embodiment is denoted by the same reference sign and its explanation will be omitted.

FIG. 5(c) is a conceptional cross sectional view of a target formed with an erosion portion according to a fifth embodiment of the present invention.

Figure 6C:
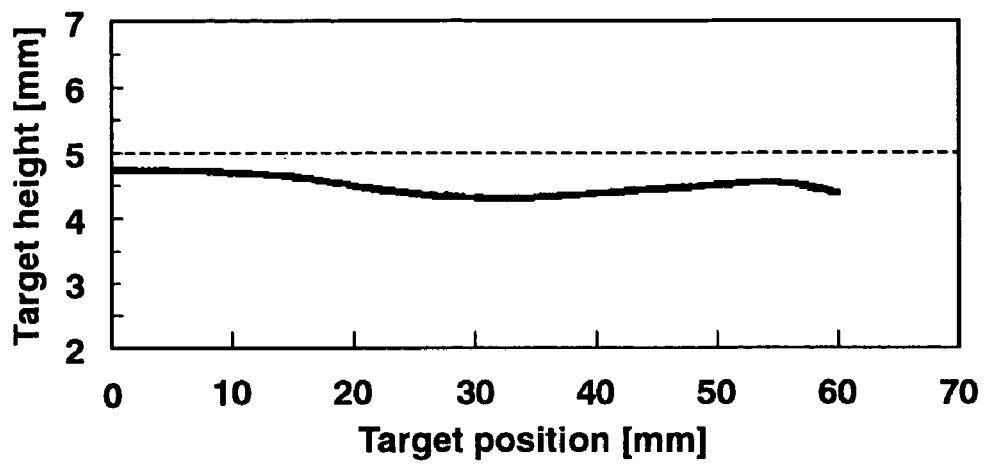
FIG. 6(c) shows a measured cross sectional view of an erosion portion formed on the target exhibiting an actual erosion portion measured in the radial direction from the center of the target according to the fifth embodiment of the present invention.
Figure 6D:
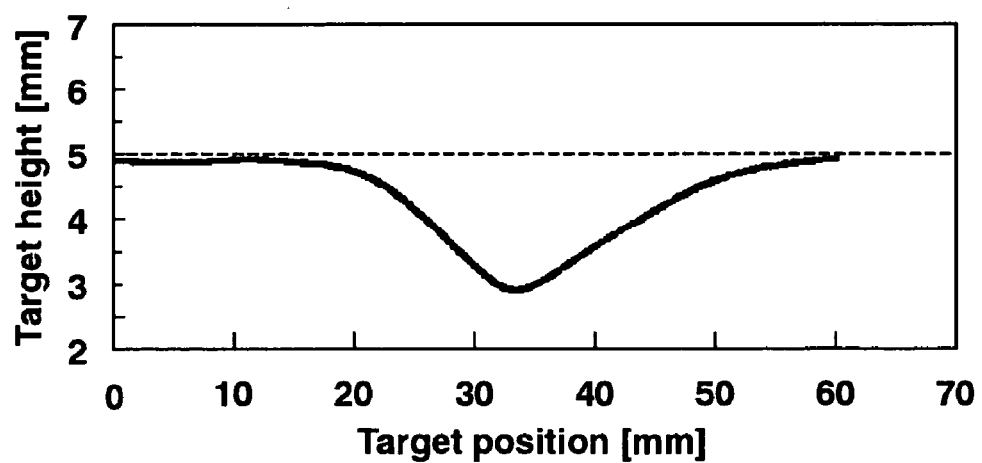
FIG. 6(d) shows a measured cross sectional view of an erosion portion formed on the target exhibiting an actual erosion portion measured in the radial direction from the center of the target according to the conventional magnetron sputtering apparatus of the prior art.

FIG. 6(c) shows a measured cross sectional view of an erosion portion formed on the target exhibiting an actual erosion portion measured in the radial direction from the center of the target according to the fifth embodiment of the present invention.

Figure 11:
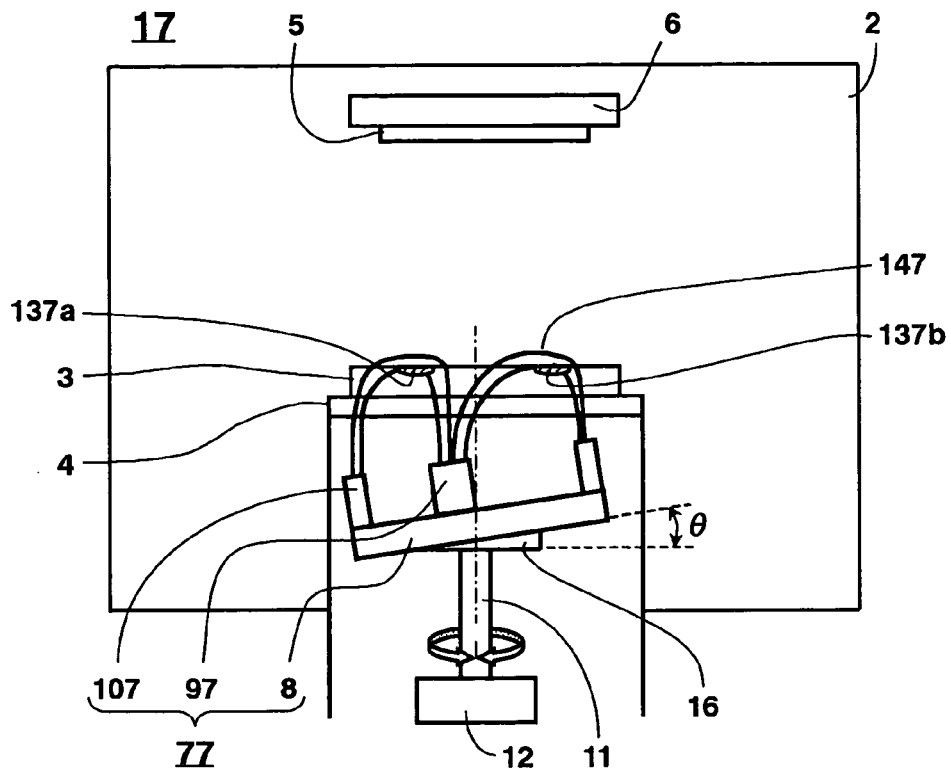
FIG. 11 is a cross sectional view of a magnetron sputtering apparatus according to the fifth embodiment of the present invention.

FIG. 11 is a cross sectional view of a magnetron sputtering apparatus according to the fifth embodiment of the present invention.

In FIG. 11, a magnetron sputtering apparatus 17 is identical to the magnetron sputtering apparatus 15 of the fourth embodiment except for a yoke-type permanent magnet 77, wherein a reference sign 147 denotes magnetic field generated by the yoke type permanent magnet 77. The yoke-type permanent magnet 77 is composed of the base 8, a first yoke-type permanent magnet 97 and a second yoke-type permanent magnet 107 and their configuration is similar to the yoke-type permanent magnet 72 shown in FIGS. 7 and 8. In a case of the yoke-type permanent magnet 77, however, the center axis of the first yoke-type permanent magnet 97 is shifted eccentrically with respect to the center axis of the base 8 more in comparison with the yoke-type permanent magnet 75 of the fourth embodiment. Consequently, the first yoke type permanent magnet 97 is rotated eccentrically around the center axis of the target 3.

As a matter of fact, the magnetron sputtering apparatus 17 of the fifth embodiment is a combination of those of the second embodiment and the fourth embodiment.

According to an examination about a shape of erosion portions 137a and 137b formed on the target 3 when the target 3 is sputtered by using the magnetron sputtering apparatus 17 of the fifth embodiment of the present invention, the shape results in a cross section shown in FIG. 5(c). Its measured cross section is shown in FIG. 6(c).

As shown in FIG. 5(c), the erosion portions 137a and 137b are symmetrical with respect to the center axis of the target 3 and expand to the circumferential area of the target 3 as well as the center portion of the target 3 more in comparison with those of the second embodiment shown in FIG. 5(b). Consequently, usable efficiency of the target 3 increases. In the case of the fifth embodiment, usable efficiency of the target 3 is improved up to 90%.

As mentioned above, according to the fifth embodiment, the circumferential area as well as the center portion of the target 3 is sputtered, so that almost all area of the target 3 enables to be used. Accordingly, the magnetron sputtering apparatus 17 that is high in usable efficiency of the target 3 enables to be realized.

In addition thereto, in the case of the fourth and fifth embodiment, the slant angle θ of the member 16 is defined to be 8 degrees. However, by controlling the shape of the yoke-type permanent magnet 75 or 77 and balance of magnetic field strength between the first yoke-type permanent magnet 95 or 97 and the second yoke-type permanent magnet 105 or 107, the same effect as the slant angle of 8 degrees can also be realized by a slant angle within a range of 5 to 15 degrees.

[Sixth Embodiment]

In this sixth embodiment, the same constitution as the first, second and fourth embodiment is denoted by the same reference sign and its explanation will be omitted.

Figure 12:
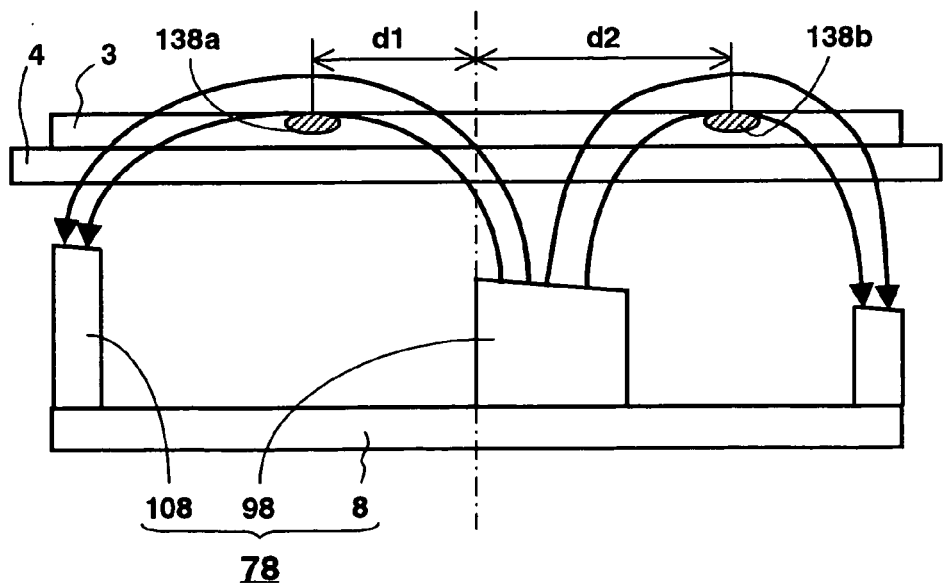
FIG. 12 is an enlarged cross sectional view of a neighborhood area of a yoke-type permanent magnet of a magnetron sputtering apparatus according to a sixth embodiment of the present invention.
Figure 13:
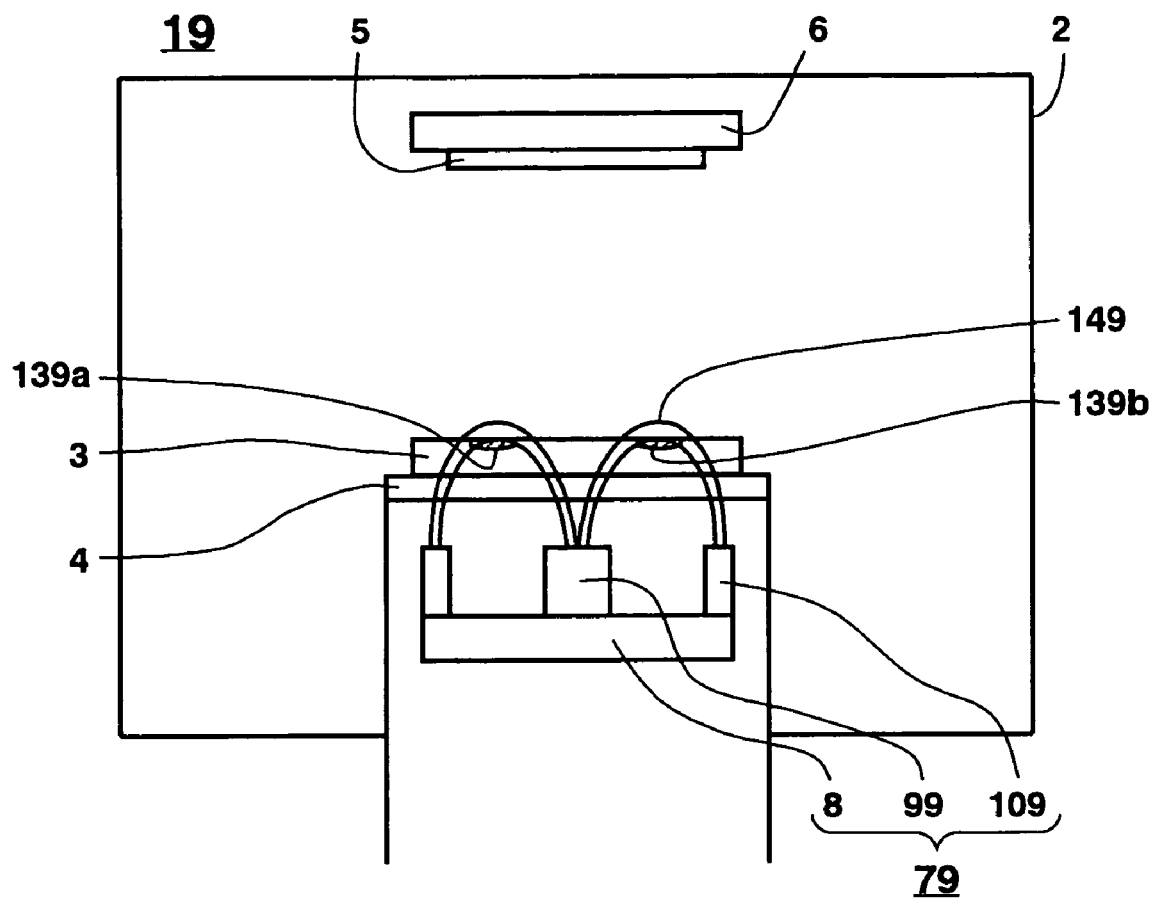
FIG. 13 is a cross sectional view of a conventional magnetron sputtering apparatus according to the prior art.

FIG. 12 is an enlarged cross sectional view of a neighborhood area of a yoke-type permanent magnet of a magnetron sputtering apparatus according to a sixth embodiment of the present invention.

A magnetron sputtering apparatus of the sixth embodiment is identical to the magnetron sputtering apparatus 1 of the first embodiment except for a yoke-type permanent magnet 78. As shown in FIG. 12, the yoke-type permanent magnet 78 is composed of a first yoke-type permanent magnet 98 and a second yoke-type permanent magnet 108. In a case of the yoke-type permanent magnet 78 of the sixth embodiment, the first yoke-type permanent magnet 98 is shifted eccentrically to the outside with respect to the center axis of the base 8 more in comparison with the yoke-type permanent magnet 71 of the first embodiment shown in FIG. 3. The yoke-type permanent magnet 78 also results in the same effect as the yoke-type permanent magnet 77 of the fifth embodiment.

It should be understood that the shape of the yoke-type permanent magnet 78 is not limited to the cylindrical shape of which top portion is cut diagonally as shown in FIG. 2, but a shape having different heights of which height steps down gradually from one end to the other like a stair is also applicable.

In the first through sixth embodiment mentioned above, the yoke-type permanent magnets 71, 72, 75, 77 and 78 are rotated with centering the center axis of the target 3 as the axis of rotation. However, the center axis of the target 3 is not always essential to be the axis of rotation. In a case that a diameter of the target 3 is 5 inches, for example, it is also acceptable that the yoke-type permanent magnet is rotated with centering a point at a distance of the order of 15 mm away from the center axis of the target 3.

As detailed above, according to the present invention, there provides a magnetron sputtering apparatus, which makes effective use of a wide area of a target while processing the magnetron sputtering.

It will be apparent to those skilled in the art that various modification and variations could be made in the magnetron sputtering apparatus in the present invention without departing from the scope or spirit of the invention.

What is claimed is:

1. A magnetron sputtering apparatus comprising:
   a vacuum chamber;
   a target;
   a cathode holding the target in the vacuum chamber;
   a substrate;
   an anode holding the substrate and being located above the cathode so as to face the substrate toward the target on the cathode;
   a permanent magnet assembly generating a magnetic field and being located under the cathode; and
   a rotation controller rotating the permanent magnet assembly around an axis with rotation occurring on a center of the target as the axis,
   the permanent magnet assembly further comprising:
   a base;
   a first permanent magnet being fixed on the base in the middle; and
   a second permanent magnet in a ring shape being fixed in a peripheral area of the base so as to surround the first permanent magnet,
   wherein a magnetic polarity of the second permanent magnet is inverse with respect to a magnetic polarity of the first permanent magnet, and
   wherein magnetic field strength of the second permanent magnet is weaker than magnetic field strength of the first permanent magnet, and
   wherein the permanent magnet assembly is formed such that a plane constituted by a top surface of the first permanent magnet and another top surface of the second permanent magnet is slanted with respect to a surface of the target.

2. The magnetron sputtering apparatus in accordance with claim 1, wherein the first permanent magnet is fixed on a middle of the base wherein a center axis of the first permanent magnet is shifted eccentrically with respect to the center of rotation of the permanent magnet assembly.

3. A magnetron sputtering apparatus comprising:
   a vacuum chamber;
   a target;
   a cathode holding the target in the vacuum chamber;
   a substrate;
   an anode holding the substrate and being located above the cathode so as to face the substrate toward the target on the cathode;
   a permanent magnet assembly generating magnetic field and being located under the cathode; and
   a rotation controller rotating the permanent magnet assembly around an axis with rotation occurring on a center of the target as the axis,
   the permanent magnet assembly further comprising:
   a base;
   a first permanent magnet being fixed on a middle of the base wherein a center axis of the first permanent magnet is shifted eccentrically with respect to the center of rotation of the permanent magnet assembly; and
   a second permanent magnet in a ring shape being fixed in a peripheral area of the base so as to surround the first permanent magnet;
   wherein a magnetic polarity of the second permanent magnet is inverse with respect to a magnetic polarity of the first permanent magnet; and
   wherein magnetic field strength of the second permanent magnet is weaker than magnetic field strength of the first permanent magnet.

4. The magnetron sputtering apparatus in accordance with claim 3, further comprising:
   a wedge shaped member having a predetermined slant angle being located between the rotation controller and the permanent magnet assembly; and
   wherein a top surface of the member contacting a bottom surface of the base is slanted with respect to the target.

* * * * *